United States Patent
Kroener et al.

(10) Patent No.: US 12,241,938 B2
(45) Date of Patent: Mar. 4, 2025

(54) METHOD FOR ESTIMATING THE STATE OF AN ENERGY STORE

(71) Applicant: Robert Bosch GmbH, Stuttgart (DE)

(72) Inventors: Christoph Kroener, Rosstal (DE); Felix Kleinheinz, Blaufelden (DE); Marco Stroebel, Stuttgart (DE); Peter Birke, Wallhausen (DE)

(73) Assignee: Robert Bosch GmbH, Stuttgart (DE)

(*) Notice: Subject to any disclaimer, the term of this patent is extended or adjusted under 35 U.S.C. 154(b) by 283 days.

(21) Appl. No.: 17/781,080

(22) PCT Filed: Nov. 24, 2020

(86) PCT No.: PCT/EP2020/083112
§ 371 (c)(1),
(2) Date: May 31, 2022

(87) PCT Pub. No.: WO2021/105071
PCT Pub. Date: Jun. 3, 2021

(65) Prior Publication Data
US 2023/0003805 A1   Jan. 5, 2023

(30) Foreign Application Priority Data
Nov. 29, 2019   (DE) .................. 10 2019 218 591.6

(51) Int. Cl.
*G01R 31/382* (2019.01)
*G01R 31/367* (2019.01)
(Continued)

(52) U.S. Cl.
CPC ......... *G01R 31/382* (2019.01); *G01R 31/367* (2019.01); *G01R 31/374* (2019.01); *G01R 31/389* (2019.01)

(58) Field of Classification Search
CPC ............... G01R 31/382; G01R 31/367; G01R 31/374; G01R 31/389
(Continued)

(56) References Cited

U.S. PATENT DOCUMENTS

| | | |
|---|---|---|
| 2013/0069660 A1 | 3/2013 | Bernard et al. |
| 2018/0026454 A1* | 1/2018 | Belkacem-Boussaid ................ H02J 7/0019 702/63 |

(Continued)

FOREIGN PATENT DOCUMENTS

| | | |
|---|---|---|
| DE | 102015225389 A1 | 6/2017 |
| DE | 102016206538 A1 | 10/2017 |

(Continued)

OTHER PUBLICATIONS

Translation of International Search Report For Application No. PCT/EP2020/083112 dated Feb. 23, 2021 (2 pages).
(Continued)

*Primary Examiner* — Ricky Go
(74) *Attorney, Agent, or Firm* — Michael Best & Friedrich LLP

(57) ABSTRACT

The invention relates to a method for estimating the state of an energy store comprising at least one electrochemical battery cell (12, 14, 16, 18, 20, 22, 24, 26, 28) using a battery management system (BMS) which comprises an impedance spectroscopy chip, having at least the following steps: a) determining the frequency-dependent impedance of the at least one electrochemical battery cell (12, 14, 16, 18, 20, 22, 24, 26, 28) using a data set recording taken in real-time, b) training an artificial neural network (60) with temperature-based training spectra as the input and a specification for temperature values belonging to each training spectrum as the output, c) taking into consideration a battery cell-to-battery cell variance (30) between the electrochemical bat- (Continued)

tery cells (12, 14, 16, 18, 20, 22, 24, 26, 28) when testing the artificial neural network (60) using weighting functions ascertained during step b) and test spectra and estimating the temperature values belonging to the test spectra according to the weighting functions ascertained in step b), and d) estimating at least one internal state (SoC, SoH, $T_{int}$) of the at least one electrochemical battery cell (12, 14, 16, 18, 20, 22, 24, 26, 28) of the energy store using the trained artificial neural network (6).

19 Claims, 3 Drawing Sheets

(51) Int. Cl.
  *G01R 31/374* (2019.01)
  *G01R 31/389* (2019.01)
(58) Field of Classification Search
  USPC .......................................................... 702/63
  See application file for complete search history.

(56) References Cited

U.S. PATENT DOCUMENTS

| | | | |
|---|---|---|---|
| 2018/0143257 | A1 | 5/2018 | Garcia et al. |
| 2020/0033414 | A1* | 1/2020 | Izumi ................... G01R 31/385 |
| 2020/0164763 | A1* | 5/2020 | Holme ................... B60L 58/16 |
| 2021/0123975 | A1* | 4/2021 | Sarwat ............... G01R 31/3648 |
| 2021/0341539 | A1* | 11/2021 | Leonard ................... G06N 3/04 |

FOREIGN PATENT DOCUMENTS

| | | | |
|---|---|---|---|
| DE | 102016219621 | A1 | 4/2018 |
| WO | 2019017991 | A1 | 1/2019 |

OTHER PUBLICATIONS

Piller et al., "Methods for state-of-charge determination and their applications", Journal of Power Sources, 2001, vol. 96, pp. 113-120.

* cited by examiner

METHOD FOR ESTIMATING THE STATE OF AN ENERGY STORE

BACKGROUND OF THE INVENTION

The invention relates to a method for estimating the state of an energy store, in particular at least one electrochemical battery cell.

DE 10 2016 219 621 A1 relates to a method for adjusting calculation parameters for temperature determination in an energy store. At least one battery module is provided, which comprises at least one battery cell, in particular for an electrically driven vehicle. The following steps are performed at preset times: a state is identified in which a dependence of the internal temperature value ($T_{int}$) on an external temperature value ($T_{ext}$), which corresponds to a temperature outside the at least one battery cell, is known. An actual internal temperature value of the energy store is determined. A present value (X) of an internal physical variable of the energy store is determined, which internal physical variable varies with a known dependency on the internal temperature ($T_{int}$) of the energy store. An internal temperature value ($T_{int}$) for the energy store is calculated from the determined value (X) using a previous set of calculation parameters (f(X)). The actual internal temperature value is compared with the calculated internal temperature value ($T_{int}$), and the set of calculation parameters (f(X)) is adapted when the calculated internal temperature value ($T_{int}$) deviates from the actual internal temperature value.

US 2018 143 257 A1 relates to a method for analyzing battery information. The battery information is determined both via passive and via active data acquisition. These parameters are combined with a decision algorithm, for developing internal battery parameters. Analysis processes include a particle filter analysis, a neural network analysis and autoregression methods for analyzing the internal battery parameters and enable battery state identification. Passive and active measurement methods are used which are recorded via a number of distributed sensors for estimating and predicting the state and the power of the electrochemical cells, batteries and battery systems. Three operations are performed which are generally processed sequentially, namely 1) state estimation and prediction of internal battery parameters based on observations and embedded knowledge, 2) state interpretation of calculated parameters, and 3) calculation of a state estimation and prediction. In order to perform these operations, a BCM system (battery condition monitoring system) is used. The BCM system performs training and learning processes which use embedded training, stochastic optimization, probability methods such as algorithms for estimating and predicting met and future values for the internal parameters of the battery under observation.

US 2013/069660 A1 relates to a method for estimating the state of a system for electrochemical storage of electrical energy, such as, for example, a battery. Impedance measurements are performed for various internal states of batteries of one and the same type as the battery to be analyzed, wherein an electrical signal is given in addition to the current passing through the batteries. A resonant circuit is used for modeling the impedances. Then, a relationship is calibrated between the state of charge (SoC) and/or the state of health (SoH) and the parameters of the resonant circuit by means of statistical analysis. Finally, the relationship of the equivalent electrical resonant circuit, which is defined for the battery, is analyzed for estimating the internal state of this battery.

The determination of the temperature of an electrochemical energy store, such as, for example, lithium-ion cells, is performed by means of reading temperature sensors, which are fixedly installed in the battery management system (BMS), on the surface of the electrochemical cell or in the vicinity thereof. The implementation of a temperature sensor in the existing battery management system is complex and expensive, however. Therefore, battery packs comprising a plurality of electrochemical cells generally only have a few temperature sensors, generally one, for cost reasons.

As an alternative to the temperature sensors there are parameterized temperature models, for example on the basis of thermal equivalent circuit diagrams. Such models can enable an estimation of the cell temperature of the battery cell using external parameters such as cell current, thermal mass, thermal conductivity and/or ambient temperature.

Impedance-based methods for temperature determination ignore the effect of the battery cell-to-battery cell variance and the influence on the estimation accuracy associated therewith. The battery cell-to-battery cell variance describes the discrepancy between the respective internal resistances of electrochemical battery cells of identical design. Nonuniform aging and production and/or storage conditions of electrochemical battery cells of identical design result in an increased battery cell-to-battery cell variance. Impedance-based state estimators, in this case state estimators for the temperature, should represent this influence in the estimation in order to increase the accuracy.

SUMMARY OF THE INVENTION

The invention proposes a method for estimating the state of an energy store comprising at least one electrochemical battery cell by means of a battery management system, which comprises an impedance measurement chip, said method comprising at least the following method steps:

a) determining the frequency-dependent impedance of the at least one electrochemical battery cell by means of a data set recording performed in real time, b) training an artificial neural network with temperature-dependent training spectra as input and preset for a temperature value belonging to each training spectrum as output, c) taking into consideration a battery cell-to-battery cell variance between the electrochemical battery cells during testing of the artificial neural network in accordance with method step b) with the weighting functions determined during method step b) with test spectra and estimating the temperatures belonging to the test spectra with weighting functions determined during method step b), d) determining at least one internal state (SoC, SoH, $T_{int}$) of the at least one electrochemical battery cell of the energy store by means of the trained artificial neural network during testing of the trained artificial neural network in accordance with method step c).

As a development of the method proposed according to the invention, the data set in accordance with method step a) is preset for the artificial neural network at an input layer in accordance with method step b) as training data set and an associated temperature value is preset as output, with the result that the artificial neural network determines weighting functions in the training phase.

In the method proposed according to the invention, a temperature of the at least one electrochemical battery cell is known as output to the artificial neural network in relation to the data set in accordance with method step a) during training.

In the method proposed according to the invention, weightings of a plurality of nodes are parameterized within an artificial neural network by a training algorithm, in particular by means of an error feedback method, until a desired input/output ratio is set, i.e. input values of the artificial neural network are in each case correctly assigned to output values.

As a development of the method proposed according to the invention, the artificial neural network is provided with at least one input layer, at least one hidden layer and at least one output layer having at least one node. The data sets of the input layer which were obtained in accordance with method step a) are given to the artificial neural network, wherein the output of the at least one internal state SoC, SoH, $T_{int}$ of the at least one electrochemical battery cell which was estimated by the artificial neural network during testing takes place at the output layer.

In the method proposed according to the invention, data sets of impedance data in the frequency range of between 0.1 Hz and 10 kHz are recorded for training in accordance with method step b), and real parts and imaginary parts are calculated from the impedance data and passed on to the artificial neural network in accordance with method step b) for training.

In the method proposed according to the invention, the artificial neural network is designed in such a way that, in accordance with method step b), a number of nodes which corresponds to a supporting number of measurement frequencies in the frequency range during the data recording is preset in the input layer.

Up to 15 nodes are arranged in at least one hidden layer of the artificial neural network used within the scope of the method proposed according to the invention for estimating temperatures by means of determined impedance data sets.

Furthermore, the invention relates to the use of the method for estimating the internal state or an internal state parameter of an energy store (SoC, SoH, $T_{int}$), in particular a battery store having at least one lithium-ion battery cell, in electrically driven vehicles.

Advantages of the invention

Owing to the solution proposed according to the invention, it is possible using mobile impedance spectroscopy to more reliably estimate an internal cell temperature for each individual battery cell of a battery pack. As a result, the number of fixedly installed temperature sensors required can be reduced to a minimum, which results in a reduction in the costs of a battery pack. The more accurate information now present on an internal battery cell temperature can advantageously be used for the implementation of safety functions, for example disconnection of the battery owing to high thermal loading and/or as input variable for more accurate cell aging models. A more accurate estimation of a residual remaining use time is now possible. Owing to the method proposed according to the invention, more accurate determination of the mean internal cell temperature of an electrochemical battery cell can be achieved. Until now, this has only been possible by virtue of the implementation of a temperature sensor in the interior of a battery cell. In solutions to date, the temperature of a battery cell can only be determined via a temperature sensor on the surface of the battery cell or with the aid of an estimation via the resistance over a family of characteristics. The parameterization required for these determination methods is firstly complex and secondly requires a relatively long measurement time, which can now be saved when using the method proposed according to the invention.

In the method proposed according to the invention, by virtue of training of an artificial neural network with large data volumes, in particular impedance data volumes, a battery cell-to-battery cell variance can also be taken into consideration in the artificial neural network for state estimation of the energy store. The battery cell-to-battery cell variance of an electrochemical battery cell describes the differences as regards characteristic cell variables such as, for example, internal resistance and/or cell capacity, which can be caused by nonuniform production and/or delivery and/or storage. These effects are intensified in the case of nonuniform aging of the battery cells.

The method proposed according to the invention enables a more reliable estimation of further internal states such as a state of health (SoH) and a state of charge (SoC). Further states can be determined from the present impedance data which reflect a frequency-dependent resistance of the electrochemical battery cells. For example, a recorded impedance curve for electrochemical battery cells can be assigned to individual battery states (SoC, SoH). As a result, there is a connection possibility for the use of central processing units, in the case of cloud computing for evaluating interconnected vehicles with installed impedance sensor systems which are ideally integrated in the battery management system.

The estimation of the SoH (state of health) is relatively inaccurate and very complex with the previously used methods. By virtue of the method proposed according to the invention, an estimation can be brought about which determines the SoH more simply for the battery cells when the vehicle is at a standstill. Furthermore, the artificial neural network can be adapted via cloud updates to the aging battery cells by means of the solution proposed according to the invention. As a result, the accuracy in the temperature estimation and the SoC (state of charge) estimation is also adapted in a simple manner. As a result, in turn the accuracy which can be achieved in the temperature estimation and in the SoC estimation is markedly improved.

BRIEF DESCRIPTION OF THE DRAWINGS

The invention will be described in more detail below with reference to the drawings, in which.

DETAILED DESCRIPTION

In the description below of the embodiments of the invention, identical or similar elements are denoted by the same reference symbols, wherein these elements have not been described again in individual cases. The figures represent the subject of the invention only schematically.

Figure 1:
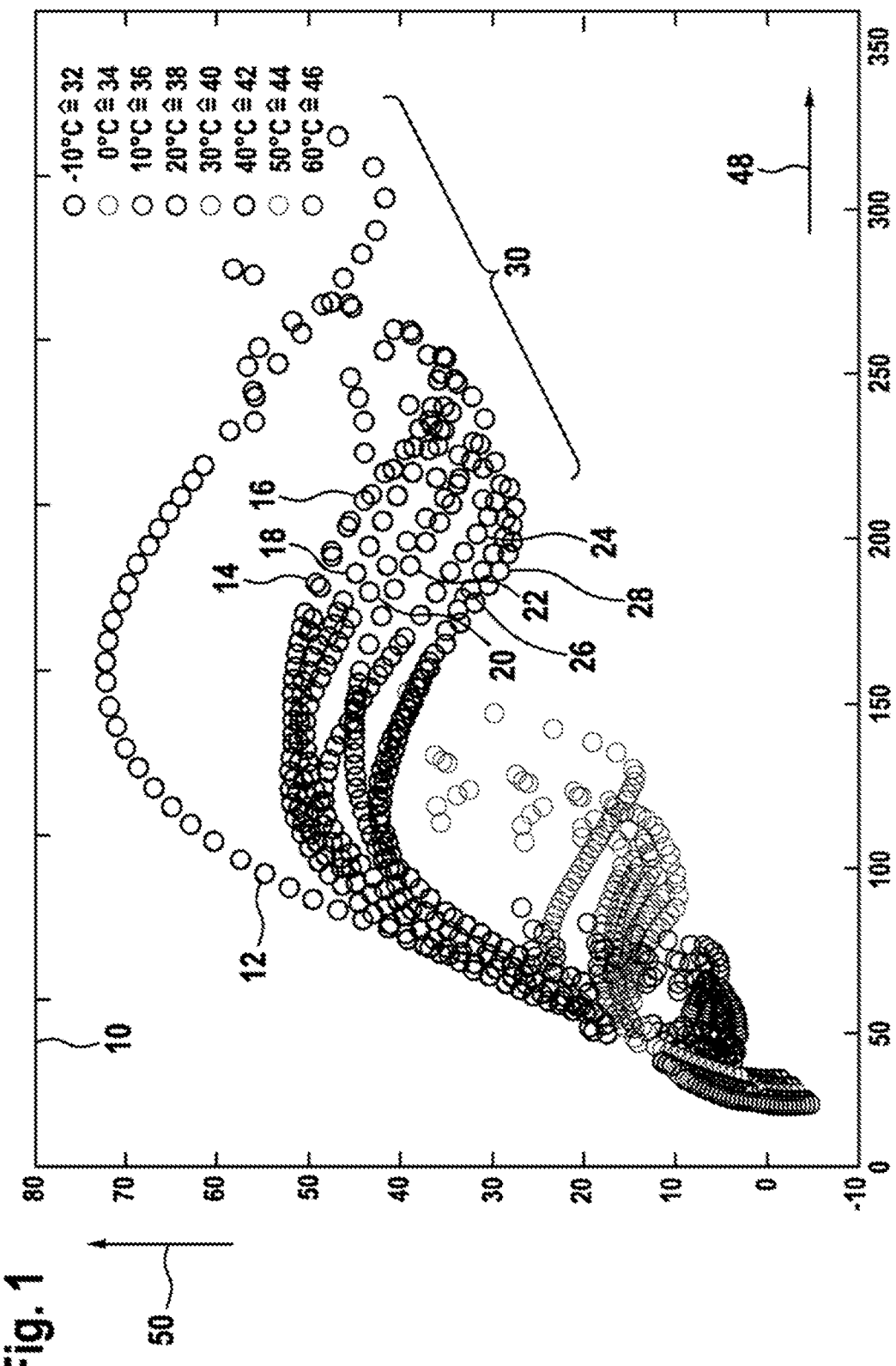
FIG. 1 shows a schematic illustration of a battery cell-to-battery cell variance for a plurality of battery cells of identical design.

FIG. 1 shows a battery cell-to-battery cell variance 30 for a plurality of battery cells 12, 14, 16, 18, 20, 22, 24, 26, 28 of identical design. In the illustration shown in FIG. 1, impedance data for a first battery cell 12, a second battery cell 14, a third battery cell 16, a fourth battery cell 18, a fifth battery cell 20, a sixth battery cell 22, a seventh battery cell 24, an eighth battery cell 26 and a ninth battery cell 28 are plotted in a Nyquist plot 10.

In the Nyquist plot 10 shown in FIG. 1, a real part 48 ($Z_{real}$ in mΩ) is plotted on an x axis while an imaginary part 50 ($Zima_{imag}$ in mΩ) of the corresponding impedance values is plotted on the y axis.

The battery cells 12, 14, 16, 18, 20, 22, 24, 26, 28 compared with one another here are, for example, lithium-iron-phosphate (LFeP) cells. Using the Nyquist plot 10 it is also possible for other electrochemical system cells, i.e. other lithium-ion battery cells, to be investigated. The Nyquist plot 10 can be used for all impedance spectra irrespective of that which is being investigated. The plot itself has nothing to do with the battery cells 12, 14, 16, 18, 20, 22, 24, 26, 28 compared with one another here and is merely a form of illustration which makes it possible to illustrate relationships. The method proposed according to the invention using an artificial neural network 60 enables the use of all electrochemical cells which can have the widest variety of chemical compositions. Lithium-ion battery cells merely describe a small section of this range.

In the Nyquist plot 10 shown in FIG. 1, accordingly different battery cell-to-battery cell variances 30 are recorded. These are given to an artificial neural network 60 (cf. illustration shown in FIG. 2) for training. In the training phase, in which temperatures belonging to the input spectra, for example, are preset as output values, the artificial neural network 60 determines weighting functions. The artificial neural network 60 adapts the internal parameters, i.e. the weighting functions, during the training phase in such a way that, during processing of the input data with the artificial neural network 60, a calculated value largely corresponds to the previously preset output value. In the test phase, on the other hand, the computation parameters are fixed within the artificial neural network 60. Therefore, input data are given in the artificial neural network 60, and these data are processed within the artificial neural network 60 in such a way, which takes place as part of computation operations, that an output value is achieved which specifies, for example, with a very high degree of accuracy, the actual temperature of a battery cell 12, 14, 16, 18, 20, 22, 24, 26, 28.

As can furthermore be seen from the Nyquist plot 10 shown in FIG. 1, the impedance data which are set in the case of eight different temperature values are recorded in each case for the nine battery cells 12, 14, 16, 18, 20, 22, 24, 26, 28. Thus, for example, a first temperature 32 is −10° C., a second temperature 34 is 0° C., a third temperature 36 is 10° C., while a fourth temperature 38 is 20° C. (approximately room temperature). Furthermore, in the Nyquist plot 10 shown in FIG. 1, a fifth temperature 40 is plotted, which is 30° C., in addition a sixth temperature 42, which corresponds to 40° C., a seventh temperature 44, which corresponds to 50° C., and finally an eighth temperature 46, which corresponds to 60° C. It is apparent from the illustration in accordance with the Nyquist plot 10 in FIG. 1 that the scatter of the cell data, i.e. the battery cell-to-battery cell variance 30, is not inconsiderable.

Accordingly, as the temperature of the battery cells 12, 14, 16, 18, 20, 22, 24, 26, 28 increases, the internal resistance is reduced owing to quicker electrochemical reactions at the electrodes, the electrolyte and their boundary layers. The data set illustrated in FIG. 1 as Nyquist plot 10 is given to an artificial neural network 60 shown in FIG. 2.

Figure 2:
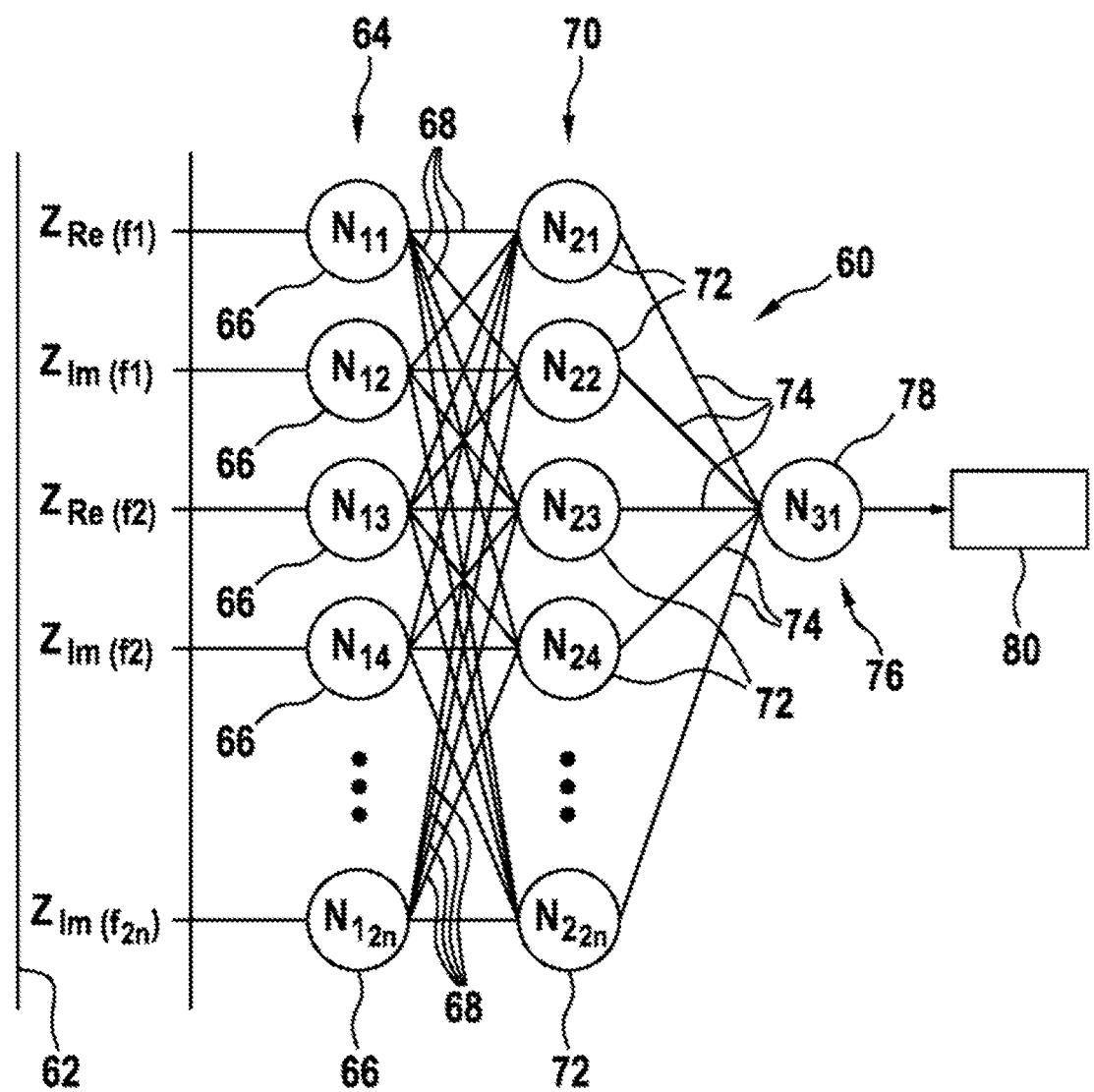
FIG. 2 shows an exemplary network structure of an artificial neural network for temperature estimation with the aid of impedance data, and FIG. 3 an estimation accuracy for an internal cell temperature for three used battery cells under load in a frequency range of between 0.1 Hz and 10 kHz.

The illustration in FIG. 2 shows a network architecture for an artificial neural network 60 for estimating the temperature with the aid of impedance data. An input vector 62 comprises impedance data as the real part 48 Re_Z and/or imaginary part 50 Im_Z. Here, other data could also be used, such as the impedance and the phase, which can be calculated from the real part 48 and the imaginary part 50. A hidden layer 70 can comprise, for example, up to 15 neurons and, with the aid of impedance training data, learns a pattern for temperature prediction. However, other network architectures could also be used which comprise a plurality of hidden layers 70 in which in each case more than 15 nodes 72 are implemented. In addition to the temperature, further states such as the state of charge (SoC) and a state of health (SoH) can also be estimated.

As can be seen from FIG. 2, the artificial neural network 60 illustrated in this figure comprises an input layer 64, which contains a number of nodes 66. In the network architecture illustrated in FIG. 2, the nodes 66 of the input layer 64 are identified by $N_{11}, N_{12}, N_{13}, N_{14}, \ldots N_{1_{2n}}$.

An input vector 62, which is given to the input layer 64 of the artificial neural network 60 in accordance with the illustration in FIG. 2, is reproduced by individual impedance data, or, for example, the imaginary and real parts 50 and 48, respectively, thereof, thus, for example, $Z_{Re(f1)}$, $Z_{Im(f1)}$, which are given to the nodes 66 $N_{13}$ and $N_{12}$, respectively, in addition, for example $Z_{Re(f2)}$, $Z_{Im(f2)}$, which are both given to the nodes 66 $N_{13}$ and $N_{14}$, and so on. It is apparent from the network architecture illustrated in FIG. 2 that the individual nodes 66 of the input layer 64 are connected to the hidden layer 70, for example, via edges 68. The at least one hidden layer 70, which is part of the artificial neural network 60, likewise comprises a plurality of nodes 72 identified as $N_{21}, N_{22}, N_{23}, N_{24}, \ldots N_{2_{2n}}$. Edges 74 again run around the individual nodes 72 of the at least one hidden layer 70 to an output layer 70. There is only one node 78, identified as N31, in the output layer 76 illustrated in FIG. 2. This produces an output, i.e. an internal cell temperature at the output, i.e. the estimated value 80 $T_{int}$ of the respective battery cell 12, 14, 16, 18, 20, 22, 24, 26, 28.

If, for example, the abovementioned nine battery cells 12, 14, 16, 18, 20, 22, 24, 26, 28 are investigated by virtue of their electrochemical impedance spectra being recorded and at the same time their cell temperature being detected via a separate sensor, the determined data set, i.e. the electrochemical impedance spectrum, is passed on as input and the respective temperature is passed on as output to the artificial neural network 60 in order to perform the training phase of the artificial neural network 60, for example, for seven of the nine battery cells 12, 14, 16, 18, 20, 22, 24, 26, 28. This means that, now, respective data sets in the form of impedance spectra are passed on as input and temperatures for a battery cell 12, 14, 16, 18, 20, 22, 24, 26, 28 are passed on as output for each of seven selected ones of the in total nine battery cells 12, 14, 16, 18, 20, 22, 24, 26, 28 to the artificial neural network 60 in order to perform the training phase at the artificial neural network 60. The artificial neural network 60 is accordingly told that the respective impedance spectra represent the input and the respective output value corresponds to the associated temperature and must assume this value. Now, computation operations take place within the artificial neural network 60, which determines internal weighting functions during the training phase such that, after mathematical processing of the input data taking into consideration determined network weighting functions, the output value appears. When the weighting functions within the artificial neural network 60 are so good that the output value is met, storage thereof takes place.

In the subsequent test phase of the artificial neural network 60, the data sets of the two still remaining ones of the in total nine battery cells 12, 14, 16, 18, 20, 22, 24, 26, 28 are now used. In this case, only the impedance spectra are passed on as input to the artificial neural network 60. These are now mathematically processed with the weighting functions previously determined and then stored during the training phase, and, at the end, an output value is estimated. This output value, within the context of the test phase of the artificial neural network 60, reflects the temperature estimated thereby of the respective battery cell 12, 14, 16, 18, 20, 22, 24, 26, 28. This estimated temperature for the respective battery cells 12, 14, 16, 18, 20, 22, 24, 26, 28 is compared with the actually measured temperature of these two battery cells 12, 14, 16, 18, 20, 22, 24, 26, 28 at the end, cf. illustration shown in FIG. 3.

The data shown in FIG. 1 are given to the artificial neural network 60 embodied in a network architecture shown in FIG. 2 for training, for example, seven of the nine battery cells 12, 14, 16, 18, 20, 22, 24, 26, 28 and, for testing, the data or impedance spectra of two of the nine battery cells 12, 14, 16, 18, 20, 22, 24, 26, 28 as part of the input vector 62 at the input layer 64. In relation to this data set, i.e. the impedance spectra, the corresponding temperature is known as output value to the artificial neural network 60. The data set of the input vector 62 is given to the input layer 64 of the artificial neural network 60 illustrated in FIG. 2 as part of a feedforward structure, for example, as training data or teaching data. In the present context, feedforward should be understood to mean that there is an input into the function or the artificial neural network 60 on the input side, i.e. on the input layer 64 of the artificial neural network 60, and an output, which arises at the output layer 76 or at the node 78, is calculated. Within the artificial neural network 60, weightings of individual neurons in the artificial neural network 60 are adapted until a desired input-to-output ratio is present. This takes place within a training algorithm. In the training algorithm of the artificial neural network 60, as part of an error feedback or backpropagation, an error is minimized until a desired input-to-output ratio is present. The impedance data of the impedance measurement are present as input vector 62 at the input layer 64. The number of nodes 66 contained in the input layer 64 is dependent on, among other factors, the supporting number used of measurement frequencies in the frequency range. In the present example of the artificial neural network 60, a node 78, which reflects an estimated temperature $T_{int}$ of the recorded impedance measurement, is positioned at the output layer 76. The number of layers between the input layer 64 and the output layer 76 can vary, depending on the number of hidden layers 70 therebetween. This may be at least 1 and can be optimized corresponding to the input data used.

Impedance data recorded under laboratory conditions train the artificial neural network 60. Now, new unknown measurement data can be presented to the trained artificial neural network 60. These data are used in the test phase of the artificial neural network 60. In this test phase, output values are estimated, wherein weighting functions which were determined, optimized and weighted in the training phase are used.

For the temperature estimation by way of impedance spectroscopy under load, an estimation of the influence of a load current is necessary. For temperatures above 0° C., it has become apparent that a frequency range for the measurement of from 0.1 Hz to 10 kHz results in a negligible error.

Figure 3:
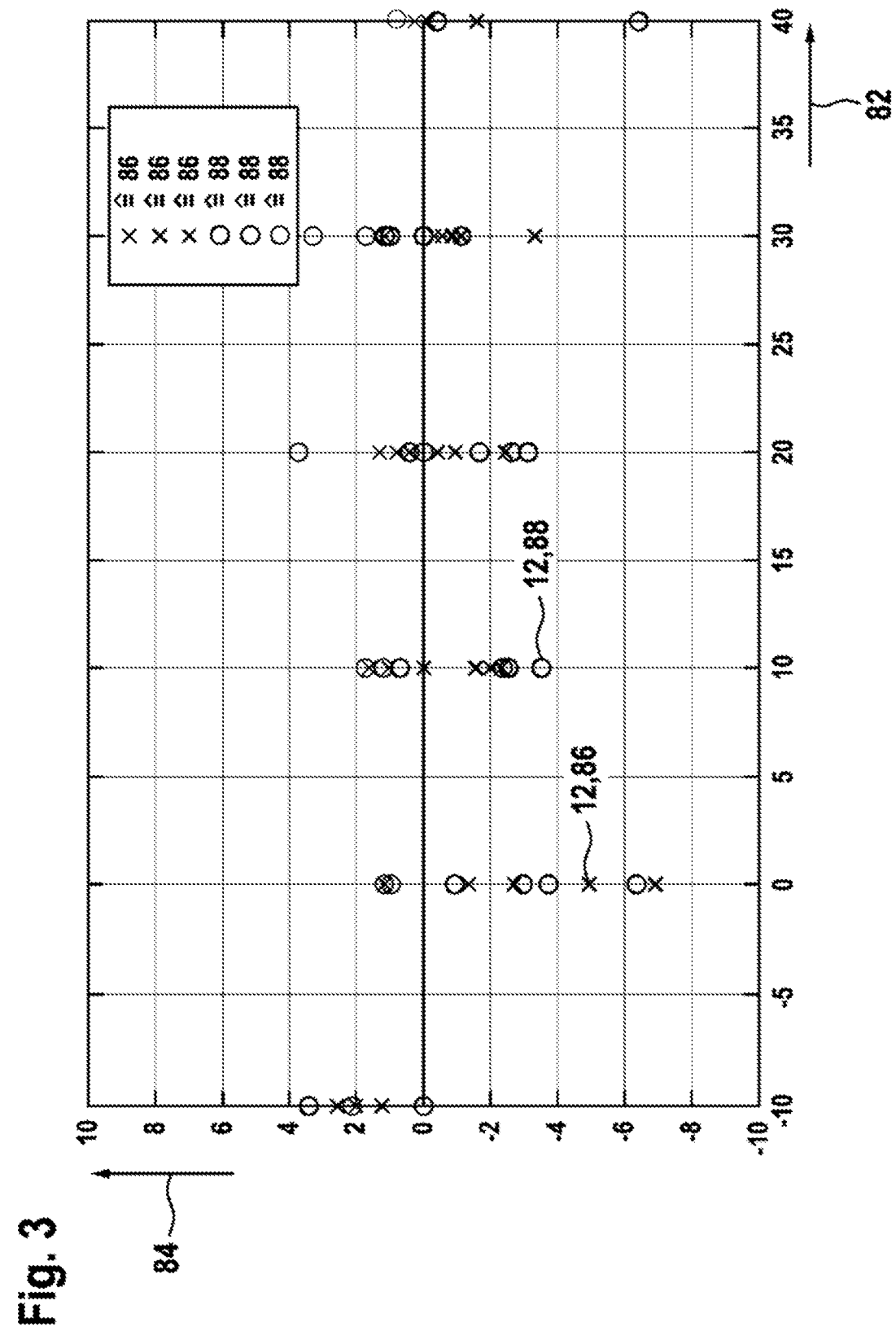

FIG. 3 shows an illustration of an estimation accuracy 84 for an internal cell temperature for used battery cells 12, 14, 16, 18, 20, 22, 24, 26, 28 illustrated therein under load within a frequency range of from 0.1 Hz to 10 kHz.

In the illustration shown in FIG. 3, the characteristic of the estimation accuracy 84 for an internal cell temperature for three used ones of the in total nine battery cells 12, 14, 16, 18, 20, 22, 24, 26, 28 under load within a frequency range of from 0.1 Hz to 10 kHz is recorded. The temperature characteristic 82 extends from −10° C. to approximately 40° C. The individual values for the estimation accuracy 84 are indicated by a cross for a first load current 86 and by a circle for a second load current 88. The illustration shown in FIG. 3 shows an error to be expected in the temperature estimation of the internal cell temperature $T_{int}$ taking into consideration the battery cell-to-battery cell variance 30. A superimposed direct current as artificial load results in a temperature error of <8° C. The error range is primarily defined by the cell scatter, i.e. the battery cell-to-battery cell variance 30, since comparison measurements without load current 86, 88 are approximately of the same order of magnitude.

It is possible to read, for example, from the illustration shown in FIG. 3 how great an error in a temperature estimation is at different temperatures for various battery cells 12, 14, 16, 18, 20, 22, 24, 26, 28 under different loads. For example, the temperature of 20° C. marks the highest point on the x axis. Compared with the y axis, this demonstrates that an error of +4° C. has arisen in the temperature estimation. This means that the artificial neural network 60 has predicted a temperature of 24° C. although the actual temperature was only 20° C.; accordingly an error of +4° C. has occurred. The conclusion from FIG. 3 is that in each case one temperature for a battery cell 12, 14, 16, 18, 20, 22, 24, 26, 28 can be estimated for various actual temperatures with the artificial neural network 60 via the impedance spectra, and that the discrepancy, i.e. the error (y axis) in the estimation accuracy 84 for the estimated temperature is only a few degrees Celsius from the actual temperature (x axis).

The solution proposed according to the invention can advantageously be used in energy storage systems which have electrochemical battery cells, in particular lithium-ion battery cells. In a particularly advantageous manner, the battery management system assigned to this energy storage system can use an impedance measurement chip. In addition, the method proposed according to the invention can be used in energy storage systems in which information on the cell temperature of the battery cell 12, 14, 16, 18, 20, 22, 24, 26, 28 is required and no temperature sensors are available. Battery management systems which are used in particular in plug-in hybrids, in hybrid vehicles and in electric vehicles can be equipped with the method proposed according to the invention, and in particular battery management systems to be expected in the future can be correspondingly retrofitted or prepared.

The invention is not restricted to the exemplary embodiments described here and the aspects highlighted therein. Rather, a large number of modifications which are within the scope of a person skilled in the art is possible within the scope specified in the claims.

The invention claimed is:

1. A method for estimating the state of an energy store comprising at least one electrochemical battery cell by means of a battery management system (BMS), which comprises an impedance spectroscopy chip, said method comprising at least the following method steps:

a) determining the frequency-dependent impedance of the at least one electrochemical battery cell from a data set recorded in real time,
b) training an artificial neural network with temperature-dependent training spectra from the data set as input and receiving a preset for a temperature value belonging to each training spectrum as output,
c) determining weighting functions based on the input and the output,
d) testing the artificial neural network by receiving a battery cell-to-battery cell variance from the data set as test spectra and estimating the temperature values belonging to the test spectra in accordance with the weighting functions determined in method step c), and
e) estimating at least one internal state of the at least one electrochemical battery cell of the energy storage with the trained artificial neural network, and
f) disconnecting the at least one electrochemical cell when the estimated temperature value exceeds a thermal load threshold.

2. The method as claimed in claim 1, wherein the data set in accordance with method step a) is given to the artificial neural network at an input layer, in accordance with method step b) is given to the artificial neural network as a training data set, with the temperature value recorded by a sensor during the real time data collection passed on as the output, and, accordance with method step b), the weighting functions are optimized and stored.

3. The method as claimed in claim 1, wherein the temperature value of the at least one electrochemical battery cell is known to the artificial neural network in relation to the data set in accordance with method step a).

4. The method as claimed in claim 1, wherein the weighting functions are associated with a plurality of nodes and are parameterized within the artificial neural network by a training algorithm until a desired input/output ratio is set and input values of the artificial neural network are correctly assigned to output values.

5. The method as claimed in claim 4, wherein the training algorithm of the artificial neural network uses at least one of an error feedback or backpropagation to iteratively minimize an error until the desired input/output ratio is reached.

6. The method as claimed in claim 4, wherein the plurality of nodes are configured to receive an input vector including the data recorded in real time.

7. The method as claimed in claim 1, wherein the artificial neural network is provided with an input layer, at least one hidden layer and an output layer having at least one node.

8. The method as claimed in claim 7, wherein the data sets determined in accordance with method step a) are received in vector form at the input layer to the artificial neural network.

9. The method as claimed in claim 8, wherein the output of the at least one internal state of the at least one electrochemical battery cell is performed in the output layer.

10. The method as claimed in claim 8, wherein the vector includes at least one variable determined by impedance spectroscopy.

11. The method as claimed in claim 7, wherein the input layer comprises a number of nodes and the hidden layer comprises a number of neurons connected to the nodes via edges.

12. The method as claimed in claim 11, wherein the number of neurons are connected to the at least one node of the output layer via edges.

13. The method as claimed in claim 1, wherein the temperature- dependent training spectra comprise impedance data in a frequency range of between 0.1 Hz and 10 kHz.

14. The method as claimed in claim 1, wherein a number of nodes which corresponds to a supporting number of measurement frequencies in a frequency range of the data set is provided in an input layer ofin the artificial neural network in accordance with method step b).

15. The method as claimed in claim 1, wherein up to 15 neurons are arranged in at least one hidden layer of the artificial neural network for learning temperature predictions with impedance data sets.

16. The method as claimed in claim 15, wherein the impedance data sets are part of the data set recorded in real time.

17. The method as claimed in claim 1, wherein, estimating the temperature values comprises estimating an influence of at least one load current or a load current of 0 A.

18. The use of the method as claimed in claim 1 for estimating the internal state of an energy store in electrically driven vehicles.

19. The method of claim 1, wherein the at least one internal state includes one of a state of charge (SoC) and a state of health (SoH) for the at least one electrochemical battery cell.

* * * * *